United States Patent
Penta et al.

(10) Patent No.: US 10,711,158 B2
(45) Date of Patent: Jul. 14, 2020

(54) AQUEOUS SILICA SLURRY AND AMINE CARBOXYLIC ACID COMPOSITIONS FOR USE IN SHALLOW TRENCH ISOLATION AND METHODS OF USING THEM

(71) Applicant: Rohm and Haas Electronic Materials CMP Holdings, Inc., Newark, DE (US)

(72) Inventors: Naresh Kumar Penta, Newark, DE (US); Zifeng Li, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/719,038

(22) Filed: Sep. 28, 2017

(65) Prior Publication Data

US 2019/0092973 A1 Mar. 28, 2019

(51) Int. Cl.
| | |
|---|---|
| *C09G 1/02* | (2006.01) |
| *H01L 21/762* | (2006.01) |
| *H01L 21/3105* | (2006.01) |
| *C09K 3/14* | (2006.01) |

(52) U.S. Cl.
CPC .............. *C09G 1/02* (2013.01); *C09K 3/1436* (2013.01); *C09K 3/1463* (2013.01); *H01L 21/31053* (2013.01); *H01L 21/76224* (2013.01)

(58) Field of Classification Search
CPC ... C09G 1/00; C09G 1/02; C09G 1/04; C09G 1/06; H01L 21/3212; H01L 21/03616; H01L 21/31051; H01L 21/76224; H01L 21/31053; C09K 3/1463; C09K 3/1409; C09K 3/1436
USPC .... 252/79.1, 79.2, 79.3, 79.4; 438/691, 692, 438/693; 216/89
See application file for complete search history.

(56) References Cited

U.S. PATENT DOCUMENTS

| | | | |
|---|---|---|---|
| 7,217,989 B2 | 5/2007 | Hiramitsu et al. | |
| 7,316,603 B2 | 1/2008 | Carter et al. | |
| 7,531,105 B2 | 5/2009 | Dysard et al. | |
| 7,846,842 B2 | 12/2010 | Carter et al. | |
| 8,492,277 B2 | 7/2013 | Guo et al. | |
| 8,691,695 B2 | 4/2014 | Moeggenborg et al. | |
| 8,778,212 B2 | 7/2014 | Jin et al. | |
| 8,999,193 B2 * | 4/2015 | Shi | H01L 21/30625 216/89 |
| 9,028,572 B2 | 5/2015 | Grumbine et al. | |
| 9,238,753 B2 | 1/2016 | Reiss et al. | |
| 9,499,721 B2 | 11/2016 | Grumbine et al. | |
| 9,631,122 B1 | 4/2017 | Dockery et al. | |
| 2008/0057716 A1 * | 3/2008 | Yamashita | C09G 1/02 438/693 |
| 2008/0188079 A1 * | 8/2008 | Kato | C09G 1/02 438/693 |
| 2015/0232704 A1 * | 8/2015 | Akutsu | C09G 1/02 216/53 |
| 2015/0376458 A1 | 12/2015 | Grumbine et al. | |
| 2016/0200943 A1 * | 7/2016 | Reichardt | C09K 3/1463 252/79.1 |
| 2017/0009102 A1 * | 1/2017 | Hoshi | B24B 37/044 |
| 2017/0183539 A1 * | 6/2017 | Kwon | H01L 21/31053 |

* cited by examiner

*Primary Examiner* — Lan Vinh
(74) *Attorney, Agent, or Firm* — Andrew Merriam; John J. Piskorski

(57) ABSTRACT

The present invention provides aqueous chemical mechanical planarization polishing (CMP polishing) compositions, such as for semiconductor substrates, comprising an abrasive of one or more dispersions of elongated, bent or nodular colloidal silica particles which contain a cationic nitrogen atom, and one or more amine carboxylic acids having an isoelectric point (pI) below 5, preferably, acidic amine carboxylic acids or pyridine acids, wherein the compositions have a pH of from 2 to 5. The compositions enable polishing at a high oxide:nitride removal rate ratio.

7 Claims, No Drawings

AQUEOUS SILICA SLURRY AND AMINE CARBOXYLIC ACID COMPOSITIONS FOR USE IN SHALLOW TRENCH ISOLATION AND METHODS OF USING THEM

The present invention relates to aqueous chemical mechanical planarization (CMP) polishing compositions comprising an abrasive of one or more dispersions of elongated, bent or nodular colloidal silica particles or their mixture with one or more dispersions of spherical colloidal silica particles and one or more amine carboxylic acids having an isoelectric point (pI) below 5, the compositions having a pH of from 2 to 5.

In front-end-of-line (FEOL) semiconductor processing, shallow trench isolation (STI) is critical to the formation of gates in integrated circuit fabrication, such as prior to formation of the transistors. In STI, a dielectric such as tetraethyl orthosilicate (TEOS) or silicon dioxide is deposited in excess in openings formed in the silicon wafer, for example, a trench or isolation area which is isolated from the remainder of the integrated circuit by silicon nitride (SiN) barrier. A CMP process is then used to remove the excess dielectric, resulting in a structure in which a predetermined pattern of the dielectric is inlaid in the silicon wafer. CMP for STI requires the removal and planarization of the silicon dioxide overburden from the isolation areas, thereby resulting in a coplanar surface with the silicon dioxide-filled trenches. In STI, the silicon nitride film surfaces must be cleared of the silicon dioxide or oxide to allow subsequent removal of the nitride hard mask in downstream processing. An acceptable oxide:nitride removal rate ratio is necessary to prevent damage to the underlying Si active areas and provide an over polish margin to ensure all pattern densities are cleared of the oxide. Further, dishing of the oxide in any trench must be avoided to prevent low threshold voltage leaks in finished gates.

Presently, users of aqueous chemical, mechanical planarization polishing (CMP polishing) compositions used with CMP polishing pads to polish substrates wish to avoid the use of ceria containing CMP polishing compositions. Ceria slurries show high selectivity for silicon dioxide over silicon nitride and avoid removal of oxide in the trench area upon exposure of silicon nitride, but are costly, have issues with RR and process stability, and are prone to causing defects during polishing. Silica slurry formulations offer lower cost, defect-free solutions, but, to date, have suffered from unsatisfactory oxide dishing control and inadequate oxide:nitride selectivity for use in STI applications.

U.S. Pat. No. 9,499,721B2, to Grumbine et al. discloses a chemical mechanical polishing composition for polishing a substrate, the composition comprising a colloidal silica dispersion which may have particles with a permanent positive charge and one or more chemical species incorporated into the particles. The chemical species in the silica particles can be a nitrogen containing compound, preferably, an aminosilane, or a phosphorous containing compound. Of the many hundreds of such chemical species, the nitrogen containing compound can be an amine carboxylic acid; however, Grumbine fails to disclose any composition in which any amine carboxylic acid which increases the selectivity of dielectric oxide:dielectric nitride removal rates. Further, Grumbine appears to require both the chemical species in the silica particle and a separate silicon nitrogen polishing inhibitor additive which is not an amine carboxylic acid.

The present inventors have endeavored to solve the problem of providing aqueous silica slurries which enable acceptable oxide dishing control and oxide:nitride removal rate selectivity for use in STI applications, as well as methods for using the slurries.

STATEMENT OF THE INVENTION

1. In accordance with the present invention, aqueous chemical mechanical planarization polishing (CMP polishing) compositions comprise an abrasive of one or more dispersions of elongated, bent or nodular colloidal silica particles which contain a cationic nitrogen atom, preferably, for example, those having an average particle aspect ratio of the longest dimension of the particle to its diameter which is perpendicular to the longest dimension of from 1.8:1 to 3:1, or a mixture thereof with a dispersion of spherical colloidal silica particles, and one or more amine carboxylic acids having an isoelectric point (pI) below 5, preferably, acidic amine carboxylic acids or pyridine acids, or, preferably amine carboxylic acids with a pI of from 2.0-4.5, wherein the compositions have a pH of from 2 to 5 or, preferably, from 3 to 4, and, further wherein, the amount of the abrasive particles as solids, ranges from 0.01 to 20 wt. %, or, preferably, from 0.1 to 15 wt. %, or, more preferably, from 0.5 to 2.5 wt. %, based on the total weight of the composition.

2. In accordance with the aqueous CMP polishing compositions as set forth in item 1, above, wherein the abrasive comprises a mixture of a dispersion of elongated, bent or nodular colloidal silica particles which contain a cationic nitrogen atom with a dispersion of spherical colloidal silica particles, wherein the amount of the dispersion of the elongated, bent or nodular colloidal silica particles ranges from 80 to 99.9 wt. %, or, preferably, from 95 to 99.9 wt. %, based on the total solids weight of the abrasive.

3. In accordance with the aqueous CMP polishing compositions as set forth in any one of items 1 or 2, above, wherein the weight average particle size (CPS) of the abrasive colloidal silica particles ranges in the dispersion of colloidal silica particles or a weighted average of such particle sizes in more than one such dispersions ranges from 10 nm to 200 nm, or, preferably, from 25 nm to 80 nm.

4. In accordance with the aqueous CMP polishing compositions as set forth in any one of items 1, 2 or 3, above, wherein the one or more amine carboxylic acids is chosen from acidic amine carboxylic acids or pyridine acids, or, more preferably, is chosen from nicotinic acid, picolinic acid, glutamic acid or aspartic acid.

5. In accordance with the aqueous CMP polishing compositions as set forth in item 4, above, wherein the total solids amount of the one or more amine carboxylic acids ranges from 0.005 to 5 wt. %, wherein, preferably, the acidic amine carboxylic acids are present in the amount of from 0.01 to 1 wt. % or, more preferably, in the amount of from 0.02 to 0.5 wt. %, or, preferably, the amine carboxylic acids are pyridine acids (excluding pyridine dicarboxylic acids), for example, in the amount of from 0.04 to 3 wt. %, or, more preferably, from 0.08 to 2 wt. %, all wt. % s based on the total weight of the composition.

6. In accordance with the aqueous CMP polishing compositions as set forth in any one of items 1, 2, 3, 4, or 5, above, wherein the compositions further comprise one or more cationic copolymers, such as a cationic copolymer of any of a diallyldialkylamine salt, a diallylalkylamine salt, or a diallylamine salt and a nonionic monomer, such as sulfur dioxide.

7. In accordance with another aspect of the present invention, methods of using the aqueous CMP polishing compositions comprise polishing a substrate with a CMP polishing pad and an aqueous CMP polishing composition as set forth in any one of items 1 to 6, above.

8. In accordance with the methods of the present invention as set forth in item 6, above, wherein the substrate comprises both silicon dioxide or tetraethoxysilicate (TEOS) and silicon nitrides, as SiN or $Si_3N_4$ or their mixtures, and the polishing results in an oxide: nitride removal rate ratio of at least 8:1, for example, from 8:1 to 100:1 or, preferably, at least 50:1, for example, from 30:1 to 70:1.

9. In accordance with the methods of the present invention for polishing a substrate as in any one of items 7 or 8, above, wherein the polishing downforce ranges from 10.3 kPa (1.5 psi) to 41.5 kPa (6 psi) or, preferably, from 12 kPa (1.8 psi) to 36 kPa (5.2 psi).

10. In accordance with the methods of the present invention for polishing a substrate as in any one of items 7, 8, or 9, above, wherein the CMP polishing composition comprises a total of from 0.5 to 5 wt. %, or, preferably, from 1 to 3 wt. %, total solids content of the dispersion of the elongated, bent or nodular colloidal silica particles, spherical colloidal silica particles, or their mixture. The CMP polishing compositions may be stored and shipped as a concentrate and then diluted with water at the time of polishing the substrate.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "amine carboxylic acid" means any organic compound which contains at least one carboxyl group and at least one amine or ammonia group. Thus, an amine carboxylic acid is not limited to naturally occurring amino acids or just those amino acids that form peptide bonds. For example, pyridine carboxylic acids are amine carboxylic acids that are not likely to form peptide bonds.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "isoelectric point" or "pI", for an amine carboxylic acid is the pH at which the amine carboxylic acid does not migrate in an electric field or electrophoretic medium; the pI refers to (i) the average of the two pKas in neutral amine carboxylic acids; (ii) the average of the two lowest pKas in acidic amine carboxylic acids (which have 2 carboxyl groups); and (iii) the average of the two highest pKas in basic amine carboxylic acids (which have two amine groups). A detailed explanation of "isoelectric point" and its calculation follows in the examples, below. Further, as used herein, the term "pI of the total abrasive" means a weighted average of the pI of each of the one or more dispersions of colloidal silica particles. Thus, if there is one such dispersion of colloidal silica particles, then the pI of the total abrasive equals the pI of that dispersion; if there is a 50/50 w/w mixture of two such dispersions and the pI of one such dispersion is 3.5 and the pI of the other such dispersion is 4.5, then the pI of the total abrasive is (3.5×0.5)+(4.5×0.5) or 4.0.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "silica particle solids" or "silica solids" means, for a given composition, the total amount of spherical silica particles, plus the total amount of elongated, bent or nodular silica particles, including anything with which any of those particles are treated.

As used herein, the term "solids" means any material other than water or ammonia that does not volatilize in use conditions, no matter what its physical state. Thus, liquid amine carboxylic acids, or additives that do not volatilize in use conditions are considered "solids".

As used herein, the term "strong acid" refers to protic acids having a pKa of 2 or less, such as inorganic acids like sulfuric or nitric acid.

As used herein, the term "use conditions" means the temperature and pressure at which a given composition is used, including increases in temperature and pressure during or as a result of use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

As used herein, the term "zeta potential" refers to the charge of a given composition as measured by a Malvern Zetasizer instrument. Unless otherwise indicated, all zeta potential measurements were made on (diluted) slurry compositions as described in the examples. The reported value was taken from an averaged measurement of zeta values using >20 acquisitions taken by the instrument for each indicated composition. As used herein, the term "elongated, bent or nodular silica particles" refers to silica particles having an aspect ratio of longest dimension to the diameter which is perpendicular to the longest dimension of, for example, from 1.8:1 to 3:1 as determined by any methods known to the ordinary skilled artisan, such as transmission electron microscopy (TEM) or as reported by a manufacturer of the dispersion of particles.

The present inventors have surprisingly found that an aqueous CMP polishing composition of an abrasive of elongated, bent or nodular colloidal silica particles which contain a cationic nitrogen atom and an amine carboxylic acid having an isoelectric point equal to or less than the pI of the total abrasive enables never before achieved removal rate selectivity of dielectric oxide substrates, such as silicon oxides, to dielectric nitride substrates, such as silicon nitrides.

The aqueous CMP polishing compositions in accordance with the present invention provide a dielectric oxide:dielectric nitride substrate removal rate selectivity ratio of from 2:1 to 150:1, or, preferably, from 25:1 to 150:1. The selectivity ratio is improved at the preferred pH of 3 to 4 and when using a higher concentration of the preferred amine carboxylic acid. The methods in accordance with the present invention enable to provision of the dielectric oxide:dielectric nitride substrate removal rate selectivity ratio of from 2:1 to 150:1, or, preferably, from 25:1 to 150:1.

Preferably, in accordance with the present invention the dielectric oxide and dielectric nitride substrates are, respectively, silicon oxides and silicon nitrides.

In accordance with the present invention, suitable colloidal silica compositions may comprise a dispersion of silica made by conventional sol gel polymerization or by the suspension polymerization of water glass so as to produce a plurality of elongated, bent or nodular silica particles in a distribution or mixture that may include a plurality of spherical silica particles.

Suitable dispersions of elongated, bent or nodular colloidal silica particles are made from suspension polymerization by hydrolytic condensation of silanols formed in a known manner from precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkoxyalkyl amines, such as ethoxypropylamine (EOPA), alkylamines or KOH, preferably, tetramethylammonium hydroxide; the hydrolytic condensation process may incorporate one or more cationic nitrogen atoms into the elongated, bent or nodular silica particles. Preferably, the elongated, bent or nodular silica particles are cationic at a pH of 4 or below.

Suitable dispersions of bent or nodular colloidal silica particles are available from Fuso Chemical Co., Ltd., Osaka, JP (Fuso) under the tradenames HL-2, HL-3, HL-4, PL-2, PL-3 or BS-2 and BS-3 slurries. Other suitable abrasives include the HL-1 and BS series abrasives, such as BS-1, BS-2 and BS-3 (Fuso). The HL and BS series particles from Fuso contain one or more nitrogen atoms which impart a cationic charge at pH 4 or below.

To insure colloidal stability of the aqueous CMP polishing compositions of the present invention and to insure that the isoelectric point of the amine carboxylic acids is equal to or less than the pI of the total abrasive, the compositions have a pH ranging from 2 to 5 or, preferably, from 3 to 4. The compositions tend to lose their stability above the desired pH range. Further, the abrasives, which have a cationic nitrogen atom, will have a higher isoelectric point than neutral silica, which as used herein has an isoelectric point of 2.0.

The aqueous CMP polishing compositions in accordance with the present invention have a positive zeta potential. Preferably, the aqueous CMP polishing compositions of the present invention have a zeta potential of from 5 to 50 mV. Such a zeta potential helps control removal rates by increasing the oxide removal rate.

Preferably, to reduce dishing of the dielectric oxide during CMP polishing, the compositions of the present invention may further comprise a cationic polymer, such as a cationic copolymer, for example, a copolymer of repeating unit, such as sulfur dioxide, with any of a diallyldialkylamine salt having a cationic nitrogen, such as diallyldimethylammonium halide, a diallylamine salt having a cationic amine group, such as a diallylammonium halide, or a diallylalkylamine salt having a cationic amine group, such as a diallylalkylammonium salt, for example, a diallylalkylammonium halide, preferably, a diallylmonomethylammonium salt. Such a copolymer can aids in silicon oxide selectivity and in preventing dishing in polishing. Amounts of the cationic copolymer range up to 0.1 wt. %, based on the total weight of the composition. Too much of the cationic copolymer can passivate the dielectric or silica surface of the substrates. The cationic copolymer of the present invention may be made by addition polymerization in the presence of or the absence of an acid, as detailed, for example, in U.S. Pat. No. 9,006,383 B2 to Yusuke et al.

The aqueous CMP polishing compositions of the present invention may comprise other cationic additives, such as polyamines, in amounts of up to 1 wt. %, based on total solids.

Suitable additives may also include, for example, cationic aminosilanes, such as, for example, N-(2-aminoethyl)-3-aminopropyltrimethoxysilane, 98% (Gelest Inc., Morrisville, Pa.) or N,N-diethylaminomethyl)triethoxysilane, 98%, (Gelest Inc.).

Desirably, the CMP polishing of the present invention is carried out in STI processing with the CMP polishing composition of the invention, preferably such that the silicon nitride is substantially removed and the silicon dioxide is adequately planarized without excessive erosion or dishing of dielectric or silicon dioxide within the trenches.

In use, STI processing of a wafer substrate involves providing a silicon substrate on which is deposited a layer of silicon nitride. Following photolithography, trenches are etched onto the substrate comprising an overlying layer of silicon nitride, and an excess of dielectric, for example, silicon dioxide is deposited thereon. The substrate is then subjected to planarization until the surface layer of silicon nitride is substantially removed, such that the dielectric or silicon oxide remaining in the trenches is approximately level with the edges of the trenches.

EXAMPLES

The following examples illustrate the various features of the present invention.

In the Examples that follow, unless otherwise indicated, conditions of temperature and pressure are ambient temperature and standard pressure.

The following materials, including those listed in Table 1, below, were used in the Examples that follow:

TABLE 1

| Silica and Other AbrasiveParticles | | | | | | |
|---|---|---|---|---|---|---|
| Aqueous Silica Slurry | Source | $pH^3$ | Particle size (CPS, nm) | Morphology | Raw Materials | Concentration (wt. % solids) | pI |
| Slurry A | HL-3 ™,1 | 7.8 | 55 | Elongated, cationic² particle | TMOS | 20 | 5.0 |

¹Fuso Chemical, Osaka, JP;
²Charge determined at pH of 4.0 and cationic particles formed with TMOS and an amine containing alkaline catalyst, such as tetramethylammonium hydroxide;
³pH as delivered from source.

The various silica particles used in the Examples are listed in Table 1, above.

Slurry B: 2 wt. % solids silica containing slurry at pH 4.5 at point of use (POU).

The following abbreviations were used in the Examples that follow:

POU: Point of use; RR: Removal rate.

Isoelectric Points of Amine Carboxylic Acids:

The isoelectric point (pI) of an amine carboxylic acid is the pH at which the amine carboxylic acid does not migrate in an electric field or electrophoretic medium. For purposes of defining pI, pKas are assigned a numerical value from lowest pH to highest pH. Amine carboxylic acids having neutral side chains are characterized by two pKas: pKa1 for the carboxylic acid and pKa2 for the amine. The pI will be halfway between, or the average of, these two pKas, i.e. pI=1/2 (pKa1+pKa2). At a pH below pKa1, the amine carboxylic acid will have an overall positive charge and at a pH above pKa, the amine carboxylic acid will have an overall negative charge. For the simplest amine carboxylic acid, glycine, pKa1=2.34 and pKa2=9.6, pI=5.97. Acidic amine carboxylic acids have an acidic side chain. The pI will be at a lower pH because the acidic side chain introduces an extra negative charge. For example, for aspartic acid there are two acidic pKas ($pKa_1$ and $pKa_2$) and one amine pKa, pKa$_3$. The pI is halfway between the two acid pKa values, i.e. pI=½ (pKa$_1$+pKa$_2$), so pI=2.77. Basic amine carboxylic acids have a pI at a higher pH because the basic side chain introduces an extra positive charge. For example, for histidine, pI is halfway between the two ammonia hydrogen pKa values pI=½ (pKa$_2$+pKa$_3$), so pI=7.59. The pI of many amine carboxylic acids is shown in Table 2, below.

TABLE 2

Pkas And Isoelectric Points Of Amine carboxylic acids

| Amine carboxylic acid | pKa1 | pKa2 | pKa3 | pI |
|---|---|---|---|---|
| 2,3-Pyridine dicarboxylic (quinolinic) acid | 0.29 | 2.43 | 4.78 | 1.36 |
| Aspartic acid | 1.88 | 3.65 | 9.6 | 2.77 |
| Glutamic acid | 2.19 | 4.25 | 9.67 | 3.22 |
| nicotinic acid | 2 | 4.85 | — | 3.425 |
| picolinic acid | 1.07 | 5.25 | — | 3.16 |
| Cysteine | 1.96 | 8.18 | — | 5.07 |
| Asparagine | 2.02 | 8.8 | — | 5.41 |
| Phenylalanine | 1.83 | 9.13 | — | 5.48 |
| Threonine | 2.09 | 9.1 | — | 5.6 |
| Glutamine | 2.17 | 9.13 | — | 5.65 |
| Tyrosine | 2.2 | 9.11 | — | 5.66 |
| Serine | 2.21 | 9.15 | — | 5.68 |
| Methionine | 2.28 | 9.21 | — | 5.74 |
| Tryptophan | 2.83 | 9.39 | — | 5.89 |
| Valine | 2.32 | 9.62 | — | 5.96 |
| Glycine | 2.34 | 9.6 | — | 5.97 |
| Leucine | 2.36 | 9.6 | — | 5.98 |
| Alanine | 2.34 | 9.69 | — | 6 |
| Isoleucine | 2.36 | 9.6 | — | 6.02 |

TABLE 2-continued

Pkas And Isoelectric Points Of Amine carboxylic acids

| Amine carboxylic acid | pKa1 | pKa2 | pKa3 | pI |
|---|---|---|---|---|
| Proline | 1.99 | 10.6 | — | 6.3 |
| Histidine | 1.82 | 6 | 9.17 | 7.59 |
| Lysine | 2.18 | 8.95 | 10.53 | 9.74 |
| Arginine | 2.17 | 9.04 | 12.48 | 10.76 |

The following test methods were used in the Examples that follow:

pH at POU:

The pH at point of use (pH at POU) was that measured during removal rate testing after dilution of the indicated concentrate compositions with water to the indicated solids content.

Example 1: Polishing and Removal Rate

Blanket wafer removal rate testing from polishing on each of tetraethoxy silane (TEOS) and silicon nitride substrates was performed using a Strasburgh 6EC 200 mm wafer polisher or "6EC RR" (Axus Technology Company, Chandler, Ariz.) at a downforce of 20.7 kPa (3 psi) and table and carrier revolution rates (rpm), respectively, of 93 and 87, and with an IC1000™ CMP polishing pad having a 1010 groove pattern (Dow, Midland, Mich.) and the indicated abrasive slurry, as shown in Table 3, below, at a given abrasive slurry flow rate 200 ml/min. A SEASOL™ AK45 AMO2BSL8031C1 diamond pad conditioner disk (Kinik Company, Taiwan) was used to condition the polishing pad. The polishing pad was conditioned in situ during polishing using a down force of 3.18 kg (7.0 lbf) at 10 sweeps/min from 4.32 cm to 23.37 cm from the center of the polishing pad. The removal rates were determined by measuring the film thickness before and after polishing using a KLA-Tencor™ FX200 metrology tool (KLA Tencor, Milpitas, Calif.) using a 49 point spiral scan with a 3 mm edge exclusion. Removal Rate results and their ratios (selectively) are shown in Table 3, below.

TABLE 3

Slurry Formulation Details, Removal Rates (RR) and Selectivities

| Example | Slurry | Solids (wt. %) | Additive | Additive (mM, wt. %) | pH | Slurry Zeta potential (mV) | TEOS RR (Å/Min) | SiN RR (Å/Min) | TEOS:SiN Selectivity |
|---|---|---|---|---|---|---|---|---|---|
| 1-1 | A | 1 | aspartic acid | (2, 0.025) | 3.6 | 27 | 1813 | 18 | 102 |
| 1-2 | A | 1 | aspartic acid | (4, 0.05) | 3.3 | 27 | 1654 | 16 | 101 |
| 1-3 | A | 1 | aspartic acid | (8, 0.1) | 3.2 | 26 | 1429 | 12 | 119 |
| 1-4 | A | 1 | nicotinic acid | (2, 0.025) | 4.2 | 18 | 1882 | 659 | 2.9 |
| 1-5 | A | 1 | nicotinic acid | (4, 0.05) | 3.9 | 20 | 1967 | 41 | 48.2 |
| 1-6 | A | 1 | nicotinic acid | (8, 0.1) | 3.7 | 19 | 1943 | 46 | 42 |
| 1-7 | A | 1 | picolinic acid | (2, 0.025) | 4.6 | 12 | 1524 | 676 | 2.3 |
| 1-8 | A | 1 | picolinic acid | (4, 0.05) | 4.3 | 15 | 1809 | 820 | 2.2 |
| 1-9 | A | 1 | picolinic acid | (8, 0.1) | 4.0 | 10 | 1939 | 66 | 29.6 |
| 1-10 | A | 1 | Quinolinic acid | (0.5, 0.008) | 3.4 | 19 | 2056 | 83 | 25 |
| 1-11 | A | 1 | Quinolinic acid | (1, 0.017) | 3.0 | 22 | 1843 | 31 | 60 |
| 1-12 | A | 1 | Quinolinic acid | (2, 0.033) | 2.6 | 20 | 1537 | 47 | 33 |
| 1-13* | A | 1 | cysteine | (4, 0.05) | 6.9 | −28 | 5 | 20 | 0.3 |
| 1-14* | A | 1 | cysteine | (8, 0.1) | 6.7 | −25 | 9 | 24 | 0.4 |

*Denotes Comparative Example.

As shown in 3, above, the aqueous abrasive slurry compositions in Examples 1-1 to 1-12 having amine carboxylic acids with an isoelectric point of <5, all achieve high oxide RR but suppress SiN RRs with increasing additive concentration. Such inventive examples provide good to excellent oxide to nitride polish selectivity, especially where the pH of the compositions lies at 4.0 or below. By comparison, the same compositions having cysteine with a pI of just above 5 does not polish either oxide or nitride. Accordingly, the use of the amine carboxylic acids of the present invention enable the achievement of the removal rate selectivities as high as 119:1.

TABLE 4

Slurry Formulation Details, Removal Rates (RR) and Selectivities

| Example | Slurry | Solids (wt. %) | Additive | Additive (mM, wt. %) | KOH (mM) | pH | Slurry Zeta potential (mV) | TEOS RR (Å/Min) | SiN RR (Å/Min) | TEOS:SiN Selectivity |
|---|---|---|---|---|---|---|---|---|---|---|
| 2-1 | A | 1 | picolinic acid | (8, 0.1) | — | 4.0 | 10 | 1939 | 66 | 29.6 |
| 2-2 | A | 1 | picolinic acid | (8, 0.1) | 0.4 | 4.3 | 15 | 1239 | 571 | 2.2 |
| 2-3* | A | 1 | picolinic acid | (8, 0.1) | 1.0 | 4.6 | 10 | 524 | 626 | 0.8 |

*Denotes Comparative Example.

In Table 4 above, Example 2-2 and 2-3, KOH base was used to raise slurry final pH. KOH effects suppression ability of picolinic acid. The examples demonstrates addition of base to amine carboxylic acid composition does effect nitride suppression ability.

In Table 5 below, final stock slurries were prepared along with a STI pattern trench oxide/dishing control additive. Nitric acid was used in example 3A to lower pH. Further, a cationic copolymer was added: a 1:1 copolymer of DADMAC and sulfur dioxide, having a weight average molecular weight (MW) (GPC using polyethylene glycol standards) of 4,000 as reported by manufacturer (PAS-A-5, Nitto Boseke Co. Ltd, Fukushima, JP). The abrasive to cationic copolymer solids weight ratio is same in all of the compositions.

TABLE 5

Concentrated compositions suitable for STI application.

| Example | Slurry | Solids (wt. %) | Aspartic acid, wt % | PAS-A-5, wt % | Biocide, actives, wt % | pH |
|---|---|---|---|---|---|---|
| 3A* | A | 15 | | 0.01 | 0.02 | 2.6 |
| 3B | A | 12 | 0.32 | 0.08 | 0.02 | 3.1 |
| 3C | A | 9 | 0.4 | 0.06 | 0.02 | 3.0 |

*Denotes Comparative Example.

Biocide used in Table 5, above, was Kordek™ MLX (The Dow chemical Company, Midland, Mich., active component: methylisothiazolinone).

In Table below 6, POU slurries were prepared by diluting slurries in Table 5, above, with deionized water and their polishing performance was evaluated on 300 mm polisher, Reflexion™ (Applied Materials, Santa Clara, Calif.). Process conditions were same as those used in Example 1, except the flow rate was 250 ml/min and the conditioner disk used is Kinik™ AD3CS-211250-1FN (Kinik Company, Taiwan). In Table 6, below, CVD (chemical vapor deposition) methods include plasma enhanced (PECVD) and low pressure (LPCVD); the experiments seek to determine removal rates of oxides: nitrides from substrates made by various methods.

TABLE 6

POU Slurry Formulation Details, Removal Rates (RR) and Selectivities

| Example | Slurry | Solids (wt. %) | pH | TEOS RR (Å/Min) | PECVD SiN RR (Å/Min) | LPCVD SiN RR (Å/Min) | TEOS:PECVD SiN | TEOS:LPCVD SiN |
|---|---|---|---|---|---|---|---|---|
| 3-1* | 3A | 1 | 3.6 | 2638 | 87 | 93 | 30 | 28 |
| 3-2* | 3A | 2 | 3.3 | 2864 | 167 | 169 | 17 | 17 |
| 3-3 | 3B | 1 | 3.4 | 2181 | 47 | — | 47 | — |
| 3-4 | 3B | 2 | 3.3 | 2387 | 96 | — | 25 | — |
| 3-5 | 3C | 1 | 3.2 | 2243 | 48 | 37 | 47 | 61 |
| 3-6 | 3C | 2 | 3.1 | 2554 | 96 | 52 | 27 | 49 |

*Denotes Comparative Example.

Performance improvement on STI Pattern wafers:

Multi-step CMP polishing—P1 (first step) and P2 (subsequent steps): STI pattern wafer substrate having a specified feature % (which corresponds to the area of active or high areas in the wafer relative to the total area thereof) with an MIT mask (SKW-3 wafers, SKW, Inc. Santa Clara, Calif.) were polished on a Mirra™ (200 mm) polishing machine or "Mirra RR" (Applied Materials, Santa Clara, Calif.) using two step method. Both step methods were performed using an IC™ polyurethane polishing pad (Dow, Shore D (2 second) hardness: 70) with 1010™ groove design (Dow) and the indicated slurry composition, using a polishing down-force of 20.7 kPa (3 psi) and a platen speed of 93 rpm and slurry flow rate of 150 ml/min. During polishing, the pad was conditioned with a Kinik™ AD3CS-211250-1FN conditioning disk (Kinik Company, Taiwan) at a 3.17 kg (7 lbf) pressure, using 100% in situ conditioning. CMP polishing was conducted such that, in the first step or P1 process, the overburden high density plasma oxide (HDP) film was removed using Slurry B (7.5× times diluted). P1 polishing was stopped when complete planarization was achieved on the 50% pattern density (PD) feature on the middle die of the wafer. At this point, ~500 Å of HDP film remained on the 50% feature. On the smaller features, such as the 10% to 40% PD features, however, the HDP film was completely removed and the underlying nitride film was exposed. Features with >50% PD still had significant dielectric film over the nitride film. Before moving to P2, the patterned wafer was cleaned using SP100 cleaning chemistry (TMAH containing) on a OnTrak™ DSS-200 Synergy™ tool (Lam Research, Fremont, Calif.) to remove slurry B particles from the wafer. As used herein, P2 polishing overpolish time is defined as extra time given to polish the pattern wafer after silicon nitride was exposed. During overpolish, trench oxide loss (A) and SiN loss (B) was monitored on different pattern density features for each step-polishing event.

Table 7A and 7B, below, compares the polishing behavior on 200 mm STI patterned wafers during a P2 process for examples 3-2*, 3-4 and 3-6 on a 40% PD and a 50% PD feature substrate, respectively.

TABLE 7A

Inventive composition performance on 40% PD feature

| | | Example | | | | |
|---|---|---|---|---|---|---|
| | | 3-2* | | 3-4 | | 3-6 |
| Performance Parameter | | A | B | A | B | A | B |
| Overpolish | 10 | 529 | 264 | 104 | 24 | 49 | 37 |
| Time, sec | 20 | 607 | 302 | 196 | 48 | 137 | 37 |
| | 30 | 680 | 355 | 283 | 71 | | |
| | 35 | | | | | 211 | 49 |

*Denotes Comparative Example.

TABLE 7B

Inventive composition performance on 50% PD feature

| | | Slurry | | | | |
|---|---|---|---|---|---|---|
| | | 3-2* | | 3-4 | | 3-6 |
| Performance Parameter | | A | B | A | B | A | B |
| Overpolish | 10 | 78 | 34 | 84 | 20 | 103 | 18 |
| Time, sec | 20 | 153 | 91 | 185 | 41 | 158 | 32 |
| | 30 | 266 | 172 | 284 | 62 | 246 | 41 |
| | 35 | | | 346 | 71 | | |
| | 40 | 337 | 227 | 424 | 95 | | |
| | 50 | 402 | 263 | | | | |

*Denotes Comparative Example.

As show in Tables 7A and 7B, above, aspartic acid containing abrasive slurries exhibit a much lower SiN loss and trench oxide loss than the slurry of Comparative Example 3-2; and the effect is improved with increasing aspartic acid concentration.

We claim:

1. An aqueous chemical mechanical planarization polishing composition comprising an abrasive of one or more dispersions of elongated, bent or nodular colloidal silica particles which contain a cationic nitrogen atom, and one or more amine carboxylic acids having an isoelectric point (pI) below 5 selected from the group consisting of nicotinic acid, picolinic acid, glutamic acid, aspartic acid and pyridine acids, wherein the composition has a pH from 2 to 5, and, further wherein, the amount of the abrasive particles as solids, ranges from 0.01 to 20 wt. %, based on the total weight of the composition, and a cationic copolymer, wherein the cationic copolymer comprises a diallyldialkylamine salt having a cationic nitrogen and a sulfur dioxide repeating unit.

2. The aqueous chemical mechanical polishing composition as claimed in claim 1, wherein the one or more dispersions of elongated, bent or nodular colloidal silica particles which contain a cationic nitrogen atom has an average particle aspect ratio of the longest dimension of the particle to its diameter which is perpendicular to the longest dimension from 1.8:1 to 3:1.

3. The aqueous chemical mechanical polishing composition as claimed in claim 1, wherein the abrasive comprises a mixture of the dispersion of elongated, bent or nodular colloidal silica particles which contain a cationic nitrogen atom with a dispersion of spherical colloidal silica particles.

4. The aqueous chemical mechanical polishing composition as claimed in claim 1, wherein the weight average particle size of the abrasive colloidal silica particles ranges in the dispersion of colloidal silica particles or a weighted average of such particle sizes in more than one dispersion thereof ranges from 10 nm to 200 nm.

5. The aqueous chemical mechanical polishing composition as claimed in claim 1, wherein the total solids amount of the one or more amine carboxylic acids ranges from 0.005 to 5 wt. %, based on the total weight of the composition.

6. The aqueous chemical mechanical polishing composition as claimed in claim 1, wherein the composition has a pH from 3 to 4.

7. The aqueous chemical mechanical polishing composition as claimed in claim 1, wherein the total solids amount of the cationic copolymer ranges from 0.001 to 0.1 wt. %, based on the total weight of the composition.

* * * * *